(12) United States Patent
Lakshmanan et al.

(10) Patent No.: US 6,923,189 B2
(45) Date of Patent: *Aug. 2, 2005

(54) CLEANING OF CVD CHAMBERS USING REMOTE SOURCE WITH CXFYOZ BASED CHEMISTRY

(75) Inventors: Annamalai Lakshmanan, Santa Clara, CA (US); Ju-Hyung Lee, San Jose, CA (US); Troy Kim, Mountain View, CA (US); Maosheng Zhao, Santa Clara, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 145 days.

This patent is subject to a terminal disclaimer.

(21) Appl. No.: 10/346,836

(22) Filed: Jan. 16, 2003

(65) Prior Publication Data

US 2004/0139983 A1 Jul. 22, 2004

(51) Int. Cl.$^7$ .............................................. B08B 9/093
(52) U.S. Cl. .................... 134/22.18; 134/1.1; 134/22.1; 134/31; 134/36; 134/902; 438/905
(58) Field of Search ................................ 134/1.1, 22.1, 134/22.18, 31, 36, 902; 438/905

(56) References Cited

U.S. PATENT DOCUMENTS

| 4,820,377 | A |   | 4/1989  | Davis et al. ............... 156/643 |
| 5,158,644 | A |   | 10/1992 | Cheung et al. ............ 156/643 |
| 5,454,903 | A | * | 10/1995 | Redeker et al. ............ 134/1.1 |
| 5,788,778 | A |   | 8/1998  | Shang et al. ............... 134/1 |
| 5,886,473 | A |   | 3/1999  | Watanabe et al. ......... 315/111.21 |
| 6,107,192 | A |   | 8/2000  | Subrahmanyan et al. ... 438/637 |
| 6,164,295 | A |   | 12/2000 | Ui et al. ................... 134/1.1 |
| 6,271,148 | B1 |  | 8/2001  | Kao et al. |
| 6,274,058 | B1 |  | 8/2001  | Rajagopalan et al. ...... 216/67 |
| 6,379,575 | B1 |  | 4/2002  | Yin et al. |
| 6,432,255 | B1 | * | 8/2002  | Sun et al. ................ 118/723 E |
| 6,435,197 | B2 | * | 8/2002  | Shin et al. ................ 134/1.1 |
| 6,437,512 | B1 |  | 8/2002  | Chen et al. ............... 315/111.21 |
| 6,461,975 | B1 |  | 10/2002 | Jeong et al. .............. 438/714 |
| 6,569,257 | B1 | * | 5/2003  | Nguyen et al. ........... 134/26 |
| 6,736,147 | B2 |  | 5/2004  | Satoh et al. |
| 2001/0025645 | A1 | * | 10/2001 | Shin et al. ............... 134/1.1 |
| 2002/0052114 | A1 |  | 5/2002  | Marks ...................... 438/689 |
| 2002/0104467 | A1 |  | 8/2002  | Chandran et al. ......... 110/236 |
| 2002/0117473 | A1 |  | 8/2002  | Yanase ..................... 216/69 |

FOREIGN PATENT DOCUMENTS

| EP | 0 555 546 A1 | 8/1993 | ........... C23C/16/44 |
| EP | 0 697 467 A1 | 2/2003 | |
| EP | 1 304 731 A1 | 4/2003 | |
| JP | 1118692 * | 7/2001 | ......... C23C/16/452 |
| WO | WO 02/12587 A2 | 2/2002 | |
| WO | WO 02/078073 A1 | 10/2002 | |

OTHER PUBLICATIONS

U.S. Appl. No. 09/710,357, filed Nov. 9, 2000.

* cited by examiner

*Primary Examiner*—M. Kornakov
(74) *Attorney, Agent, or Firm*—Moser, Patterson & Sheridan

(57) ABSTRACT

A method and apparatus for cleaning a processing chamber are provided. The cleaning method includes the use of a remote plasma source to generate reactive species and an in situ RF power to generate or regenerate reactive species. The reactive species are generated from a carbon and fluorine-containing gas and an oxygen source.

13 Claims, 2 Drawing Sheets

US 6,923,189 B2

CLEANING OF CVD CHAMBERS USING REMOTE SOURCE WITH CXFYOZ BASED CHEMISTRY

BACKGROUND OF THE INVENTION

1. Field of the Invention

Embodiments of the present invention generally relate to a method of cleaning a processing chamber using a remote plasma source and in situ radio frequency (RF) power.

2. Description of the Related Art

In the fabrication of integrated circuits and semiconductor devices, materials such as oxides are typically deposited on a substrate in a processing chamber, such as a deposition chamber, e.g., a chemical vapor deposition (CVD) chamber. The deposition processes typically result in deposition of some of the material on the walls and components of the deposition chamber. The material deposited on the chamber walls and components can affect the deposition rate from substrate to substrate and the uniformity of the deposition on the substrate.

Similarly, when materials such as oxides are etched from a substrate in a processing chamber, such as an etching chamber, some of the materials that are removed from the substrate typically are deposited on the walls and components of the etching chamber. The material deposited on the chamber walls and components can affect the uniformity and consistency of etching processes performed in the chamber.

Several methods of cleaning processing chambers have been developed. For example, a remote plasma source can be used to provide a source of reactive species, such as fluorine radicals, that react with deposited material in a processing chamber, forming volatile compounds that can be removed from the processing chamber. However, cleaning a processing chamber using known remote plasma sources is a time consuming process. Remote plasma sources typically provide reactive species, such as free radicals, at a flow rate and an intensity that do not result in a level of free radical or ion bombardment that can damage the deposition chamber. However, more time is required to clean a chamber when a low intensity cleaning process such as a remote plasma clean process is used. A lengthy chamber cleaning period decreases the number of substrates that can be processed in a given time, since the chamber typically cannot be used for processing during the cleaning period.

Providing in situ radio frequency (RF) power in a processing chamber to generate a plasma of cleaning gases is another method that can be used to clean a processing chamber. Reactive species generated in the plasma bombard and react with deposited material in the processing chamber, forming volatile compounds that can be removed from the deposition chamber. The reactive species can also bombard the chamber and remove deposited material from the chamber surfaces. However, the reactive species often damage the chamber due to the energy imparted to the species in the chamber. Furthermore, the reactive species can react with the material forming the chamber lining and create undesirable contaminants that may land on and harm a substrate undergoing processing in the chamber. For example, if $NF_3$ is introduced into a chamber, the fluorine ions generated in the plasma can combine with aluminum used as a lining material in the deposition chamber and form particles of aluminum fluoride.

The removal of contaminating particles from a processing chamber is becoming increasingly important because the device sizes are becoming smaller and aspect ratios are becoming more aggressive. With smaller feature sizes and more aggressive aspect ratios, the size and number of contaminating particles must be minimized in order to maintain the performance of the device.

Therefore, there remains a need for a method of cleaning processing chambers efficiently, while minimizing contaminant generation.

SUMMARY OF THE INVENTION

Embodiments of the present invention generally relate to methods of cleaning processing chambers, such as deposition chambers and etching chambers. In one embodiment, a method of cleaning a process chamber includes generating reactive species from a carbon and fluorine-containing gas and an oxygen source in a remote plasma source connected to the processing chamber. The reactive species are introduced into the processing chamber, and RF power is applied in the processing chamber. In one embodiment, the carbon and fluorine-containing gas is $CF_4$, and the oxygen source is oxygen. Preferably, substantially all of the carbon and fluorine-containing gas is dissociated by the remote plasma source, and any of the carbon and fluorine-containing gas not dissociated by the remote plasma source is dissociated by the RF power applied in the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a method for cleaning processing chambers, such as deposition chambers and etching chambers used in the fabrication of integrated circuits and semiconductor devices. The deposition chambers that may be cleaned using the methods described herein include chambers that may be used to deposit oxides, such as carbon-doped silicon oxides, and other dielectric materials.

An example of a chamber that may be cleaned using the methods described herein is the PRODUCER® chemical vapor deposition (CVD) reactor, available from Applied Materials, Inc. of Santa Clara, Calif. The PRODUCER® chemical vapor deposition reactor has two isolated processing regions that may be used to deposit carbon-doped silicon oxides and other materials. A chamber having two isolated processing regions is described in U.S. Pat. No. 5,855,681, which is incorporated by reference herein.

The PRODUCER® chemical vapor deposition reactor has a port to which remote plasma sources may be attached. A PRODUCER® chemical vapor deposition reactor with an ASTRON®ex remote plasma source available from MKS Instruments may be used in embodiments of the methods described herein.

In the embodiments described herein, one remote plasma source may be attached to a CVD reactor having two isolated processing regions such that the remote plasma source is connected to both isolated processing regions. However, the processes described below may also be performed by using two remote plasma sources connected, such as via a tee line, to each processing region, and adjusting the flow rates accordingly.

The gas flow rates described below refer to flow rates experienced by the CVD reactor as a whole, i.e., both of the isolated processing regions. Thus, the gas flow rates experienced by each of the processing regions of the CVD reactor are approximately half the gas flow rates experienced by the CVD reactor as a whole. While some examples of embodiments are described with respect to cleaning a processing region of a CVD reactor that has two processing regions, the methods described herein may be used to clean a processing region of a chamber that has one or more than two processing regions.

Figure 1:
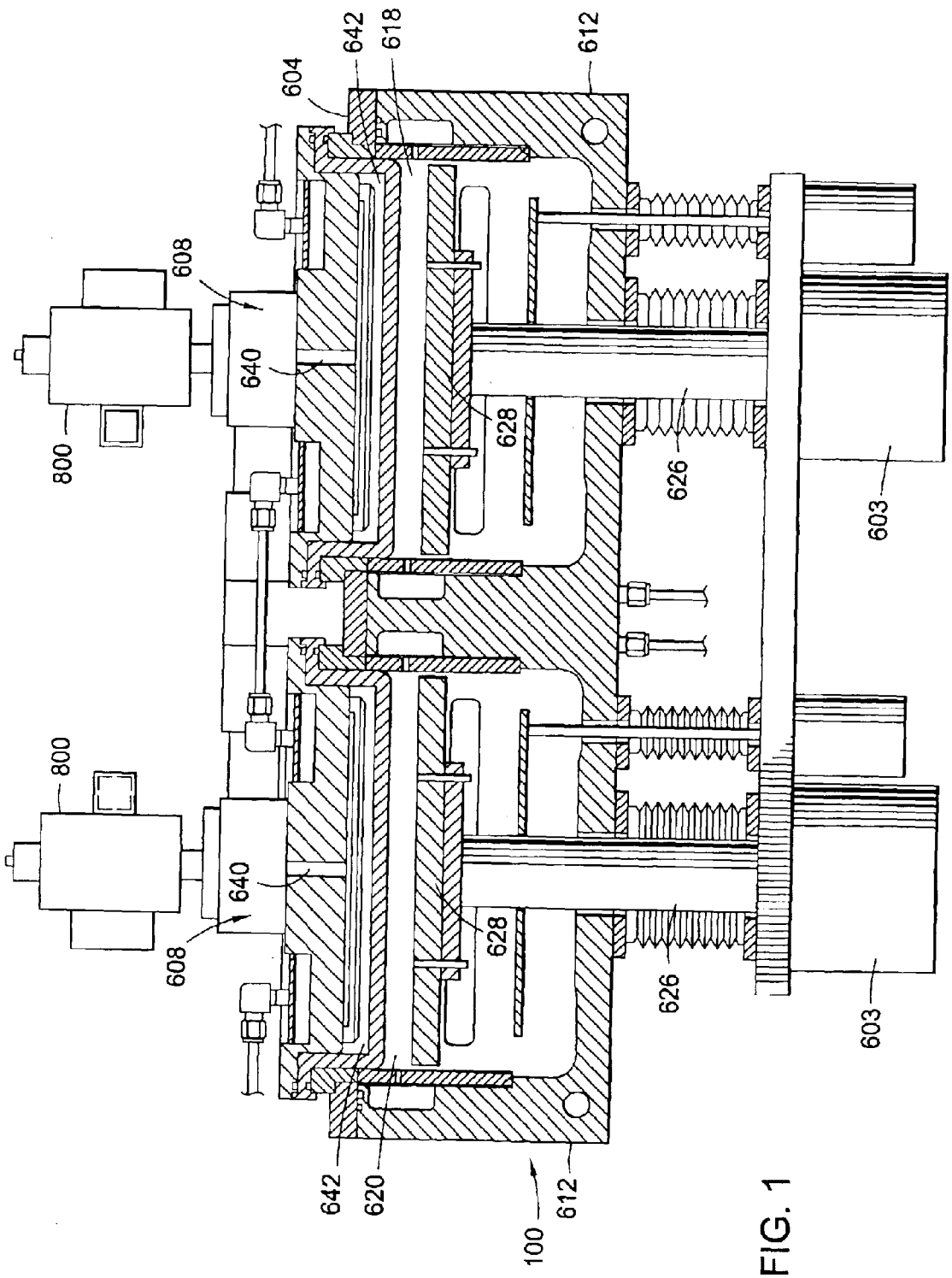
FIG. 1 is a cross sectional view of one embodiment of a deposition chamber.

An example of a chamber that has two processing regions and two remote plasma sources is shown in FIG. 1. The chamber 100 has processing regions 618 and 620. One remote plasma source 800 is connected to processing region 618, and the other remote plasma source 800 is connected to processing region 620. A heater pedestal 628 is movably disposed in each processing region 618, 620 by a stem 626 which extends through the bottom of the chamber body 612 where it is connected to a drive system 603. Each of the processing regions 618, 620 also preferably includes a gas distribution assembly 608 disposed through the chamber lid 604 to deliver gases into the processing regions 618, 620. The gas distribution assembly 608 of each processing region also includes a gas inlet passage 640 which delivers gas into a shower head assembly 642.

Figure 2:
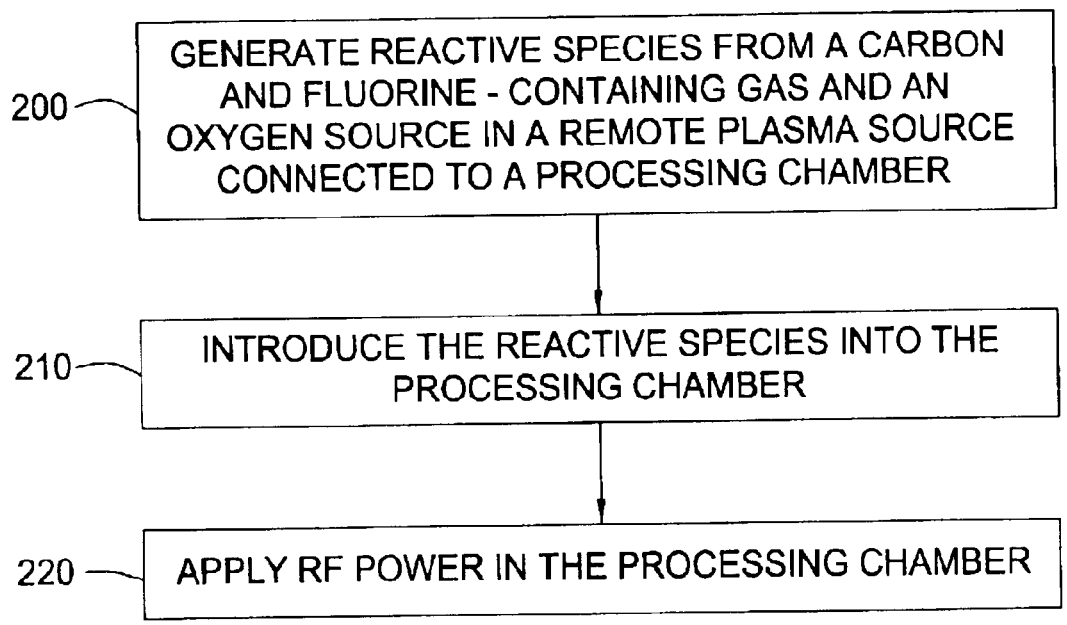
FIG. 2 illustrates a processing sequence according to various embodiments of the invention.

One embodiment of a chamber cleaning method described herein is summarized in FIG. 2. Reactive species are generated from a carbon and fluorine-containing gas and an oxygen source in a remote plasma source connected to the processing chamber, as shown in step 200. The carbon and fluorine-containing gas may be a fluorocarbon, such as $CF_4$, $C_2F_4$ or $C_2F_6$. Preferably, the ratio of the carbon and fluorine-containing gas to the oxygen source is about 2:1 to about 1:4. Alternatively, the carbon and fluorine-containing gas may include oxygen and have the general formula $C_xF_yO_z$, wherein x is an integer from 1 to 6, y is an integer from 1 to 14, and z is an integer from 1 to 4. The oxygen source may be an oxidizing gas such as oxygen, ozone, or nitrous oxide. Preferably, the oxygen source is oxygen and the carbon and fluorine-containing gas is $CF_4$.

The reactive species may be generated by introducing an inert gas, such as argon, into the remote plasma source and striking a plasma. After the plasma is struck, a carbon and fluorine-containing gas and an oxygen source are introduced into the remote plasma source, and reactive species from the carbon and fluorine-containing gas and an oxygen source are generated. Preferably, generating the reactive species includes dissociating substantially all of the carbon and fluorine-containing gas and substantially all of the oxygen source. A high level of dissociation of the carbon and fluorine-containing gas and the oxygen source is achieved by applying a high power level, such as about 13 kilowatts or greater, to generate the reactive species in the remote plasma source. A high power remote plasma source, such as the ASTRON®ex remote plasma source can provide a power of at least about 13 kilowatts.

The reactive species are then introduced into the processing chamber from the remote plasma source, as shown in step 210. Typically, a carrier gas is introduced from a separate gas source into the processing chamber with the reactive species. Preferably, the carrier gas is an inert gas, such as helium. In one embodiment, the carrier gas is introduced into the processing chamber at a flow rate of about 100 sccm to about 1000 sccm. The reactive species from the carbon and fluorine-containing gas are introduced into the processing chamber at a flow rate of about 400 sccm to about 1400 sccm. The reactive species from the oxygen source are introduced into the processing chamber at a flow rate of about 400 sccm to about 1400 sccm.

After the reactive species are introduced into the processing chamber, RF power is applied in the processing chamber, as shown in step 220. The RF power is delivered to the processing region of the chamber by energizing an RF source connected between two electrodes in the processing region. The two electrodes typically comprise the substrate support member or susceptor of the chamber, and the faceplate or "showerhead" through which processing gases are distributed into the processing region and which is directly connected to the RF power source. The RF power is preferably provided at about 100 watts to about 900 watts at a frequency of about 13.56 MHz. The RF power is preferably provided at a level such that about 95% or greater of the carbon and fluorine-containing gas is dissociated. While up to 100% of the carbon and fluorine-containing gas may be dissociated in the remote plasma source, a small amount of the reactive species may recombine to reform the carbon and fluorine-containing gas or other products that are less effective than the reactive species for cleaning the chamber. The recombination of the reactive species may occur during the transfer of the reactive species to the processing chamber or after the reactive species are introduced into the processing chamber. The application of RF power in the processing chamber can regenerate reactive species after they have recombined or generate reactive species from any of the carbon and fluorine-containing gas or oxygen source that was not activated in the remote plasma source. Typically, the RF power is applied for a period of time sufficient to remove material deposited on an interior surface of the chamber, such as material deposited during a previous deposition or etching process in the chamber. For example, the chamber may be cleaned by applying the RF power for about 50 seconds to about 300 seconds. Generally, the reactive species react with material deposited on one or more interior surfaces of the chamber and form volatile components that can be removed from the chamber.

The temperature of the chamber during the cleaning may be about 100° C. to about 500° C. The pressure may be about 1 torr to about 10 torr, and the spacing between the faceplate and the substrate support may be about 200 mils to about 1000 mils.

Preferably, the cleaning process described herein is performed after the processing of each substrate in a processing region of a chamber. For example, the cleaning process may be performed after a deposition process is performed on a substrate in the chamber.

While an embodiment of the cleaning process has been shown and described with respect to a deposition chamber, the cleaning process described herein may also be performed on an etching chamber, such as an eMAX™ chamber, an IPS™ chamber, a DPS™ chamber, and an ASP chamber, all of which are available from Applied Materials, Inc., of Santa Clara, Calif.

It is believed that the chamber cleaning process described herein provides a good, efficient chamber cleaning method. The remote plasma source provides a large number of reactive species, which accelerates the chamber cleaning process. The in situ RF power in the chamber further accelerates the chamber cleaning process by regenerating reactive species from recombined species and/or by generating new reactive species.

The high power level of the remote plasma source described herein enables the use of $CF_4$ as a chamber cleaning gas. Low power remote plasma sources typically cannot provide enough power to sufficiently dissociate $CF_4$ for an efficient chamber cleaning process. Complete or nearly complete dissociation of fluorocarbons is also desirable because fluorocarbons are believed to have potentially negative effects on the environment.

Embodiments of the cleaning method described herein also provide an alternative to $NF_3$-based chamber cleaning methods. While $NF_3$ can be used to effectively clean processing chambers, $NF_3$ is very expensive. Furthermore, when $NF_3$ was used in the place of the carbon and fluorine-containing gas and oxygen source in a cleaning method as described herein, the cleaning method was about 30 seconds longer than the method with the carbon and fluorine-containing gas and oxygen source, while the $NF_3$ method and the method described herein produced similar cleaning results. Thus, the method described herein enhances the throughput of the chamber, as a shorter chamber cleaning time is required.

An example of a preferred embodiment will now be described.

EXAMPLE 1

A plasma was struck in an ASTRON®ex remote plasma source containing helium and connected to a PRODUCER® CVD reactor. $CF_4$ and oxygen were then introduced into the remote plasma source and reactive species were generated. The activated $CF_4$ was introduced into the PRODUCER® CVD reactor at a flow rate of about 1000 sccm and the activated oxygen was introduced into the reactor at a flow rate of about 1000 sccm. Helium was introduced into the reactor from a separate gas source at a flow rate of about 500 sccm. The temperature of the chamber was about 350° C. and the pressure in the chamber was about 1.6 torr. The spacing between the faceplate and the substrate support was about 450 mils. An in situ radio frequency power of about 350 watts was delivered to the processing region at a frequency of 13.56 MHz. The chamber was cleaned for about 270 seconds. About 1 μm of previously deposited material was removed from a dummy wafer on the substrate support during the cleaning process.

While the foregoing is directed to embodiments of the present invention, other and further embodiments of the invention may be devised without departing from the basic scope thereof, and the scope thereof is determined by the claims that follow.

What is claimed is:

1. A method of cleaning a processing chamber, comprising:

generating reactive species from a carbon and fluorine-containing gas including oxygen and an oxygen source in a remote plasma source connected to the processing chamber;

introducing the reactive species into the processing chamber; and applying radio frequency (RF) power in the processing chamber, wherein the processing chamber is used to deposit carbon-doped silicon oxides on a substrate and the generating reactive species is performed after the substrate has been treated with a deposition process in the processing chamber.

2. The method of claim 1, further comprising introducing a carrier gas into the processing chamber with the reactive species.

3. The method of claim 2, wherein the carrier gas is helium.

4. The method of claim 1, wherein the generating reactive species comprises dissociating substantially all of the carbon and fluorine-containing gas.

5. The method of claim 4, wherein the generating reactive species further comprises dissociating substantially all of the oxygen source.

6. The method of claim 1, wherein the RF power is applied such that about 95% or greater of the carbon and fluorine-containing gas is dissociated.

7. A method of cleaning a processing chamber, comprising:

generating reactive species from a carbon and fluorine-containing gas comprising oxygen and an oxygen source in a remote plasma source connected to the processing chamber;

introducing the reactive species into the processing chamber; and applying radio frequency (RF) power in the processing chamber.

8. The method of claim 7, wherein the generating reactive species is performed after a substrate has been treated with a deposition process in the processing chamber.

9. The method of claim 8, wherein the applying RF power is performed for a period of time sufficient to remove material deposited on an interior surface of the processing chamber during the deposition process.

10. The method of claim 7, wherein the generating reactive species is performed after a substrate has been treated with an etching process in the processing chamber.

11. The method of claim 10, wherein the applying RF power is performed for a period of time sufficient to remove material deposited on an interior surface of the processing chamber during the etching process.

12. The method of claim 7, wherein the generating reactive species comprises dissociating substantially all of the carbon and fluorine-containing gas comprising oxygen.

13. The method of claim 7, wherein the RF power is applied such that about 95% or greater of the carbon and fluorine-containing gas comprising oxygen is dissociated.

* * * * *